(12) United States Patent
Carr

(10) Patent No.: US 7,681,043 B1
(45) Date of Patent: Mar. 16, 2010

(54) SYSTEM AND METHOD FOR CONFIGURING DEVICE FEATURES VIA PROGRAMMABLE MEMORY

(75) Inventor: Jeffrey Douglas Carr, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 1084 days.

(21) Appl. No.: 10/141,197

(22) Filed: May 8, 2002

(51) Int. Cl.
G06F 11/30 (2006.01)

(52) U.S. Cl. .................. 713/189; 713/182; 713/190; 713/194; 380/241; 726/26

(58) Field of Classification Search ............. 711/163, 711/103; 713/190, 194, 182, 189; 380/28, 380/241; 725/152; 726/26
See application file for complete search history.

(56) References Cited

U.S. PATENT DOCUMENTS

| | | | |
|---|---|---|---|
| 5,349,249 A | | 9/1994 | Chiang et al. |
| 5,390,317 A | * | 2/1995 | Weiss et al. .................. 711/103 |
| 5,442,704 A | * | 8/1995 | Holtey .......................... 711/163 |
| 5,737,760 A | | 4/1998 | Grimmer, Jr. et al. |
| 6,076,149 A | | 6/2000 | Usami et al. |
| 6,240,516 B1 | * | 5/2001 | Vainsencher ................. 713/190 |
| 6,351,814 B1 | * | 2/2002 | Batinic et al. ................ 713/194 |
| 7,058,177 B1 | * | 6/2006 | Trimberger et al. ............ 380/28 |

FOREIGN PATENT DOCUMENTS

| | | |
|---|---|---|
| WO | WO 94/10687 | 5/1994 |
| WO | WO 00 24192 | 4/2000 |
| WO | WO 00 76117 | 12/2000 |
| WO | WO 02/11289 | 2/2002 |

OTHER PUBLICATIONS

P.J. Lenior, "Functional Model for the DVB CPCM Framework," Royal Philips Electronics Presentation, Feb. 2002.

Rowan Vevers, "DVB Sub-Group on Commercial Requirements for Copy Protection Systems Report to the Eighteenth Meeting of the DVB Commercial Module (DVB-CM)," DVB Report, DVB-CP8(00)7, Oct. 2000.

Jeff Carr, "Response to DVB Call for Information Copy Protection and Digital Rights Management Technologies," Broadcom Corp., Oct. 2001.

"Call for Proposals for Content Protection & Copy Management Technologies," DVB, DVB Technical Module Sub-Group on Copy Protection Technologies, DVB CPT rev 1.2, Jul. 2001.

(Continued)

*Primary Examiner*—Kimyen Vu
*Assistant Examiner*—Baotran N To
(74) *Attorney, Agent, or Firm*—McAndrews, Held & Malloy, Ltd.

(57) ABSTRACT

Systems and methods that may configure features or functions of a device, such as a set top box, for example, using a chip are provided. The chip may include a processor and a memory array. The memory array may include a non-volatile memory and may be in communications with the processor. The non-volatile memory may include a set of mode control bits, each mode control bit being one-time programmable. The device features may be securely programmed via the set of mode control bits of the non-volatile memory that may be programmed during a programming cycle and may not be modified further after the completion of the programming cycle.

20 Claims, 3 Drawing Sheets

| Description | No. of Bits | Program Cycle Protection | CRC Protection | Visible | HW Dedicated |
|---|---|---|---|---|---|
| Device ID | 64 | YES | YES | YES | YES |
| Key 1 | 64 | YES | YES | NO | YES |
| Key 2 | 64 | YES | YES | NO | YES |
| Mode Control 0 | 16 | | | | |
|   Encrypt_Engine | 1 | YES | YES | YES | YES |
|   Data_Output | 1 | YES | YES | YES | YES |
|   Test_Port_Diag | 1 | YES | YES | YES | YES |
|   Reserved | 13 | YES | YES | YES | - |
| Mode Control 1 | 16 | | | | |
|   Reserved | 7 | NO | NO | YES | - |
|   Lock_A | 1 | NO | NO | YES | YES |
|   Reserved | 7 | NO | NO | YES | - |
|   Lock_B | 1 | NO | NO | YES | YES |
| CRC32 | 32 | YES | NO | NO | YES |
| Total Bit Count | 256 | | | | |

OTHER PUBLICATIONS

Ji et al., "Open Letter following Proposal DVB-CPY-719," Feb. 2002.
"SCTE Proposed Standard Head-end Implementation of OpenCAS™," Society of Cable Telecommunications Engineers, Inc., Engineering Committee, Digital Video Subcommittee, SCTE DVS278r1, Jul. 2000.
"Data-Over-Cable Interface Specification," MCNS Holdings, L.P., Security Systems Specification, SP-SSI-I01-970506, 1997.
"DES CBC Packet Encryption," General Instrument Corp., SCTE DVS/042, Nov. 1996.
"CD-Rom Based Application Software Consumer and SOHO Copying Trends," Merrill Research Associates, Apr. 2000.
"White Paper—The Ins and Outs of Content Delivery Networks," Stardust.com inc., Dec. 2000.
"CD-Rom Unauthorized Copying Study Executive Summary," Merrill Research Associates, Apr. 1999.
"UDAC-M Host Link Specification, Part 1: Overview," Keitaide-Music Consortium, Ver. 0.9, Dec. 2000.
"Keitaide-Music Technical Specification Part I Overview," Keitaide-Music Consortium, Ver. 1.0, Dec. 2000.
"EPRS8 White Paper," SecureMedia, Inc., 2000.
William Raike "Detailed Supplemental Technical Description of the RPK Public-Key Cryptographic System," 1996.
Joseph M. Winograd, "Audio Watermarking Technologies for Protection of Digital Audio and Video—Presentation to DVD CPTWG," Verance Corporation, Sep. 2000.
John Paddleford, "Digital Rights Management—Protection Your Content," Microsoft Corporation, undated.
"Common Interface Specification For Conditional Access and Other Digital Video Broadcasting Decoder Applications," DVB, DVB Document A017, May 1996.
"Call for Proposals for Content Protection & Copy Management Technologies," DVD, DVB Technical Module Sub-Group on Copy Protection Technologies, Rev. 1.2, Jul. 2001.
Bechtolsheim et al., "Responses to DVB-CP Requirements (DVB-CM283) for the OCCAM Open Conditional Content Access Management System," Cisco Systems, Inc. Oct. 2001.
"NetDRM Technology Response to DVD Call for Proposals for Content Protection & Copy Management Technologies," DVD, Matsushita Electric Industial Co., Ltd., Oct. 2001.
"Proposal for Content Protection & Copy Management Technologies submitted to DVB (Digital Video Broadcasting," Veridian, Oct. 2001.
"Response to the DVB-CPT Call for Proposals for Content Protection & Copy Management Technologies," Royal Phillips Electronics N.V., Oct. 2001.
Kish et al., "An Information Paper in Response to the Call for Proposals Issued by the DVB Copy Protection Technologies Sub-Group of the DVB Technical Module," VWM Companies, Oct. 2001.
"Proposals for Content Protection and Copy Management Technologies," Sony International (Europe), Oct. 2001.
Olsthoom et al., "Flexcop—A Flexible Copy Portection Framework," Flexcop, undated.
"Proposals for DVB Content Protection & Copy Management Technologies," Nokia, Version 1.0, Oct. 2001.
"4C Entity Response to DVB CPT Call for Proposals Regarding Content Protection & Copy Management Technologies—Content Protection System Architecture—A Comprehensive Framework for Content Protection, with CPPM and CPRM Technologies," 4C Entity, LLC, Oct. 2001.
"SmartRight Answer to the Call for Proposals for Content Protection & Copy Management Technologies," Thomson Multimedia et al., Oct. 2001.
"Answer to Call for Proposals for Content Protection & Copy Management Technologies," Thales Communication, Oct. 2001.
"IBM Response to DVB CPT Call for Proposals Regarding Content Protection & Copy Management: xCP Cluster Protocol," IBM, Oct. 2001.
"Digital Transmission Licensing Administrator's (DTLA) Response to DVB-CPT Call for Proposals Concerning Content Protection & Copy Management Technologies Protected Transport of Commercial Entertainment Content Using DTCP Technology," DTLA, 2001.
Winograd et al., "Audio Watermarking System for Content Protection within a DVB CPCM Environment," Verance Corporation, Oct. 2001.
"Proposed Baseline DVB-CPCM Response to DVB-CPT Call for Proposal Concerning Content Protection & Copy Technologies," Matsushita Electric Industrial Co., Ltd., Oct. 2001.
"Response to the Call for Proposals Content Protection and Copy Management Technologies by DVB Copy Protection Technologies Sub-Group of DVB Technical Module," Pioneer Corporation, Oct. 2001.
Kudumais, et al., "OPIMA/OCCAMM: A Solution to DVB Call for Proposals for Content Protection & Copy Management Technologies," OCCAMM, undated.
Capitant et al., "Digital Rights Management & Copy Protection An Information Paper in Response to the Call for Proposals Issued by the DVB Copy Technologies Sub-Group of the DVB Technical Module," Macrovision Corporation and Widevine Technologies Oct. 2001.
"Content Protection System Architecture A Comprehensive Framework for Content Protection, with High-Bandwidth Digital Content Protection (HDCP) Technology," Digital Content Protection, LLC, Oct. 2001.
"Digimarc Response to DVB_CPCM CFP: Watermarking Applications Information Paper," Digimarc Corporation, Oct. 2001.
Agnelli et al., "LAN Interconnection Via ATM Satellite Links for CAD Applications: The UNOM Experiment," undated.
Löytänä et al., "Session Management Problems in Narrowband Interactive Services," Ad Hoc Group on Systems for Interactive Services, undated.
"Presentation to the TM," Simulcrypt Technical Group, undated.
"The DVB Project Promotion and Communication Module," DVB Project Office, Digital Video Broadcasting Presentation, undated.
"Digital Video Broadcasting (DVB); Support for Use of Scrambling and Digital Broadcasting Systems," European Telecommunications Standards Institute, ETSI Technical Report ETR 289, Oct. 1996.
"Digital Video Broadcasting (DVB); DVB SimulCrypt; Part 1: Head-end architecture and synchronization," European Telecommunications Standards Institute, ETSI Technical Report TS 101 197-1 v1.1.1 1997-06.
"IPsec Processing," Microsoft Corporation et al, 1998.
"IPsec Databases," Microsoft Corp. Document, undated.

* cited by examiner

| Description | No. of Bits | Program Cycle Protection | CRC Protection | Visible | HW Dedicated |
|---|---|---|---|---|---|
| Device ID | 64 | YES | YES | YES | YES |
| Key 1 | 64 | YES | YES | NO | YES |
| Key 2 | 64 | YES | YES | NO | YES |
| Mode Control 0 | 16 | | | | |
| Encrypt_Engine | 1 | YES | YES | YES | YES |
| Data_Output | 1 | YES | YES | YES | YES |
| Test_Port_Diag | 1 | YES | YES | YES | YES |
| Reserved | 13 | YES | YES | YES | - |
| Mode Control 1 | 16 | | | | |
| Reserved | 7 | NO | NO | YES | - |
| Lock A | 1 | NO | NO | YES | YES |
| Reserved | 7 | NO | NO | YES | - |
| Lock B | 1 | NO | NO | YES | YES |
| CRC32 | 32 | YES | | NO | YES |
| | | | | | |
| Total Bit Count | 256 | | | | |

Fig. 2

SYSTEM AND METHOD FOR CONFIGURING DEVICE FEATURES VIA PROGRAMMABLE MEMORY

FIELD OF THE INVENTION

The present invention relates generally to systems and methods for configuring a device and, more specifically, to systems and methods for configuring device features via a programmable memory.

BACKGROUND OF THE INVENTION

Devices are generally manufactured with particular features and functions that meet the particular requirements of customers. However, this can be a costly undertaking, especially where a wide variety of features and functions are available and customer preferences are equally diverse. To make a new line of devices that have the features or perform the functions according to each customer's specification would require a process involving additional design time and manufacture set up, and such a process would lack many of the efficiencies that result from economies of scale. Under these circumstances, such a customized solution may be impractical.

In addition, even if such a customized solution is implemented, it still lacks the flexibility to permit modification (e.g., enabling or disabling) of particular features or functions as customer needs change. Thus, a customer who would like to enable or to disable a particular feature or function would have to purchase another new line of devices that are designed and manufactured to incorporate the modifications.

On the other hand, a device with all of the available features and functions enabled might not necessarily meet the requirements of most customers. For example, some customers might not have the advanced systems capable of handling devices enabled with the highest levels of security or encryption. Accordingly, such a solution still would lack flexibility. Furthermore, a device with all of the available features and functions enabled may be more costly than most customers would be willing to pay.

Further limitations and disadvantages of conventional and traditional approaches will become apparent to one of skill in the art, through comparison of such systems with the present invention as set forth in the remainder of the present application with reference to the drawings.

What is needed, therefore, is a device that, for example, permits a customer to conveniently enable or disable allowed features and functions, but that also prohibits a customer from enabling non-allowed features and functions, in a cost efficient and secure manner.

SUMMARY OF THE INVENTION

Aspects of the present invention may be found in systems and methods that may configure features (functions) of a device using a chip. In one embodiment, the present invention may provide a chip that includes a processor and a memory array. The memory array includes a non-volatile memory and is in communications with the processor. The non-volatile memory includes a set of mode control bits, each mode control bit being one-time programmable. The device features are securely programmed via the set of mode control bits.

In another embodiment, the present invention may provide a system that configures functions of a device using an on-chip, one-time programmable non-volatile memory. The non-volatile memory includes a set of mode control bits whose bit values correspond to a particular configuration of the device functions. The set of mode control bits may be one-time programmable during a programming cycle.

In yet another embodiment, the present invention may provide a method that configures functions of a device using a non-volatile memory. The method may include the steps of beginning a programming cycle; programming mode control bits of the non-volatile memory; terminating the programming cycle; and determining programmed configurations of the device by reading the programmed mode control bits of the non-volatile memory.

In a further embodiment of the above-described method, the method may include the additional step of not allowing further programming of the mode control bits after terminating the programming cycle.

These and other features and advantages of the present invention may be appreciated from a review of the following detailed description of the present invention, along with the accompanying figures in which like reference numerals refer to like parts throughout.

BRIEF DESCRIPTION OF THE DRAWINGS

FIG. 2 shows a table illustrating an example of a memory allocation within a non-volatile memory according to the present invention.

DETAILED DESCRIPTION OF THE INVENTION

Figure 1:
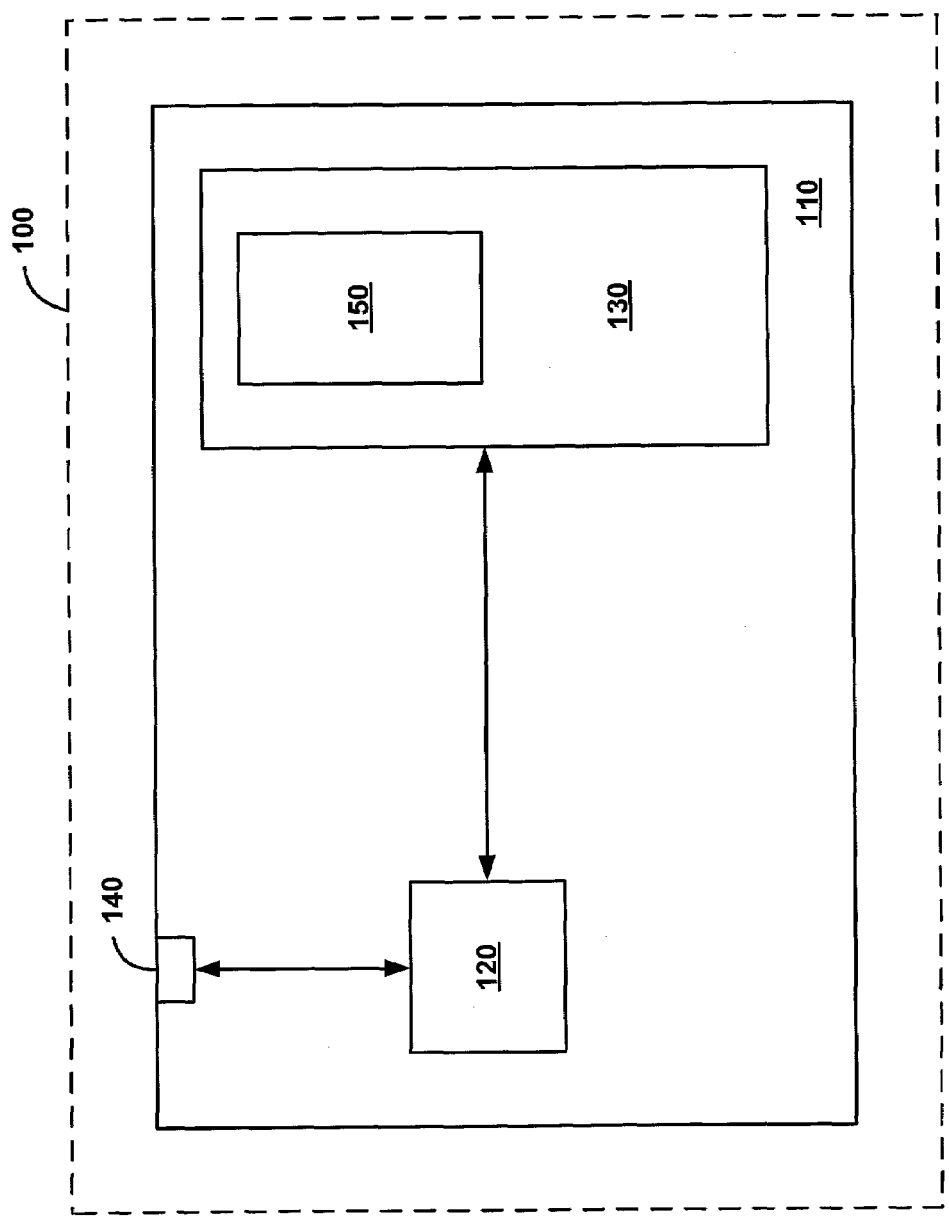
FIG. 1 shows an example of a device including a chip according to the present invention.

FIG. 1 shows an example of a device 100 including a chip 110 according to the present invention. Although the chip 110 is illustrated as part of the device 100, it may be external to the device 100 and merely coupled to the device 100. The chip 110 may include a processor 120, a memory array 130 and a chip interface 140. The memory array 130 may include a non-volatile memory 150 such as, for example, a one-time programmable non-volatile memory. The non-volatile memory 150 may include, for example, banks of mode control bits. The processor 120 is coupled to the memory array 130 and the chip interface 140 via buses or other conventional communication means. The device 100 communicates with the chip 110 via, for example, the chip interface 140. In one embodiment, the device 100 is a set top box, for example. Of course, other types of devices are also contemplated by the present invention.

In operation, the non-volatile memory 150 of the memory array 130 can be programmed during a programming cycle by the processor 120 or by data received by the processor 120 via the chip interface 140. During the programming cycle, the banks of mode control bits are programmed which correspond to configurations of features or functions of the device 100 that are desired. Each bank of mode control bits is protected against future writing by a lockout mechanism which, when enabled, prohibits the bits from changing states. A bank can be locked out using protection built into the programming cycle. For example, when the programming cycle is complete, future writing of particular mode control bits can be prohibited.

In some embodiments, the present invention may provide some customers with access to special internal device capabilities (e.g., cases in which the customer has paid the appropriate licensing fee or premium fee), but allow other customers to disable or to be unable to access such capabilities. For example, if a customer desires a special algorithm or a special cryptographic configuration enabled within the device 100, the appropriate mode control bits can be programmed during the programming cycle to enable the desired configurations, features or functions of the device 100. If a customer wants to disable a feature or, perhaps, if the customer is not permitted to access such feature, the non-volatile memory 150 may be so programmed or the device 100 may resort to default values stored in the non-volatile memory 150. Alternatively, the device 100 may not use the non-volatile memory 150 at all during set up or operation.

Programming can be initiated, for example, locally at the manufacturing site or at a point of service or can be initiated remotely at a central processing center that can send the appropriate programming data via cables or wirelessly, ultimately reaching the chip interface 140. Such programming data and the transmission thereof may benefit from appropriate security measures (e.g., encryption schemes) and unique identification (e.g., a unique identifier of the device 100 or the chip 110).

FIG. 2 shows a table illustrating an example of the memory allocation within the non-volatile memory 150 according to the present invention. The first two columns of the table provide field descriptions and respective bit allocations. The next four columns of the table provide memory bit attributes. Program Cycle Protection indicates whether the memory bits can only be written during a programming cycle and whether the memory bits are locked-out or protected from programming at the completion of the programming cycle. Cyclic Redundancy Check (CRC) Protection indicates whether the memory bits are protected by CRC and whether the memory bits are included in a CRC calculation. For example, CRC32 is a 32-bit CRC calculated on fields starting with the Device ID and continuing through the Mode Control 0 bank of mode control bits. Visible indicates whether the memory bit is readable, for example, by the processor 120, the device 100 or outside of the device 100. Hardware Dedicated indicates whether the bit states are used as part of internal hardware logic or are used only as programmable information bits.

The fields within the non-volatile memory can be generally described as memory data bits, mode control bits and memory management bits. The memory data bits may include, for example, the Device ID, Key 1 and Key 2. Device ID is 64-bits that are visible (i.e., that can be read out by the processor 120) and can provide a unique identifier for the device 100. Key 1 and Key 2 are each 64-bits, not visible outside the device 100 and are used inside the chip 110 as input to cryptographic functions (e.g., data encryption standard (DES) techniques). Additional information relating to cryptography, encryption and other matters can be found in U.S. patent application Ser. No. 09/900,224 entitled "System and Method for the Concealment of Device Input Parameters" to Jeffrey D. Carr which was filed on Jul. 6, 2001, and which is hereby incorporated herein by reference in its entirety.

The mode control bits may include, for example, Mode Control 0 and Mode Control 1. In this example, each bit in the mode control bits may represent a function or feature configuration for the device 100. However, a plurality of bits in the mode control bits may represent one or more function or feature configurations for the device 100. Mode control bits can also be used to control onboard logic in other sections of the device 100.

For example, the Encrypt_Engine mode control bit may have a default value which configures the device 100 for a particular level of encryption or security (e.g., selectable between no encryption, DES or 3DES). When the Encrypt_Engine mode control bit is programmed (e.g., from a binary 0 to a binary 1), the device 100 may be forced into the highest security mode (e.g., 3DES).

In another example, the Data_Output mode control bit may have a default value which enables a data output interface of the device 100. When the Data_Output mode control bit is programmed, the device 100 may disable the data output interface. Similarly, the Test_Port_Diag mode control bit may enable or disable access to test ports of the device 100 depending upon whether the Test_Port_Diag mode control bit stored the default or programmed value.

Lock_A and Lock_B bits may, for example, lockout programming of the respective seven reserved bits of Mode Control 1. The reserved bits may be provide for the selection of features or functions outside of the programming cycle. Accordingly, some of the mode control bits can be locked out after the programming cycle, while other mode control bits can be programmed (e.g., one-time programmed) and locked out by programming the appropriate lockout bit.

Other features and functions of the device 100 that may be configured via the mode control bits include, for example, display, sound or authentication configurations. The above-described features and functions of the device 100 are not intended to be exhaustive and may be dependent upon the choice of the device 100. Accordingly, one of ordinary skill in the art can determine additional features and functions of the device 100 (e.g., a set top box) that can be configured by the control mode bits without undue experimentation.

The memory management bits may include, for example, CRC32 and Programming Bits. The CRC32 is a 32-bit result from running the CRC32 algorithm over at least a portion of the non-volatile memory bits such as, for example, the bits which are part of Device ID, Key 1, Key 2 and Mode Control 0. Accordingly, data contents can be validated. The other memory management bits include the Programming Bits, which are, for example, two bits used to indicate the programming status of the device 100.

Figure 3:
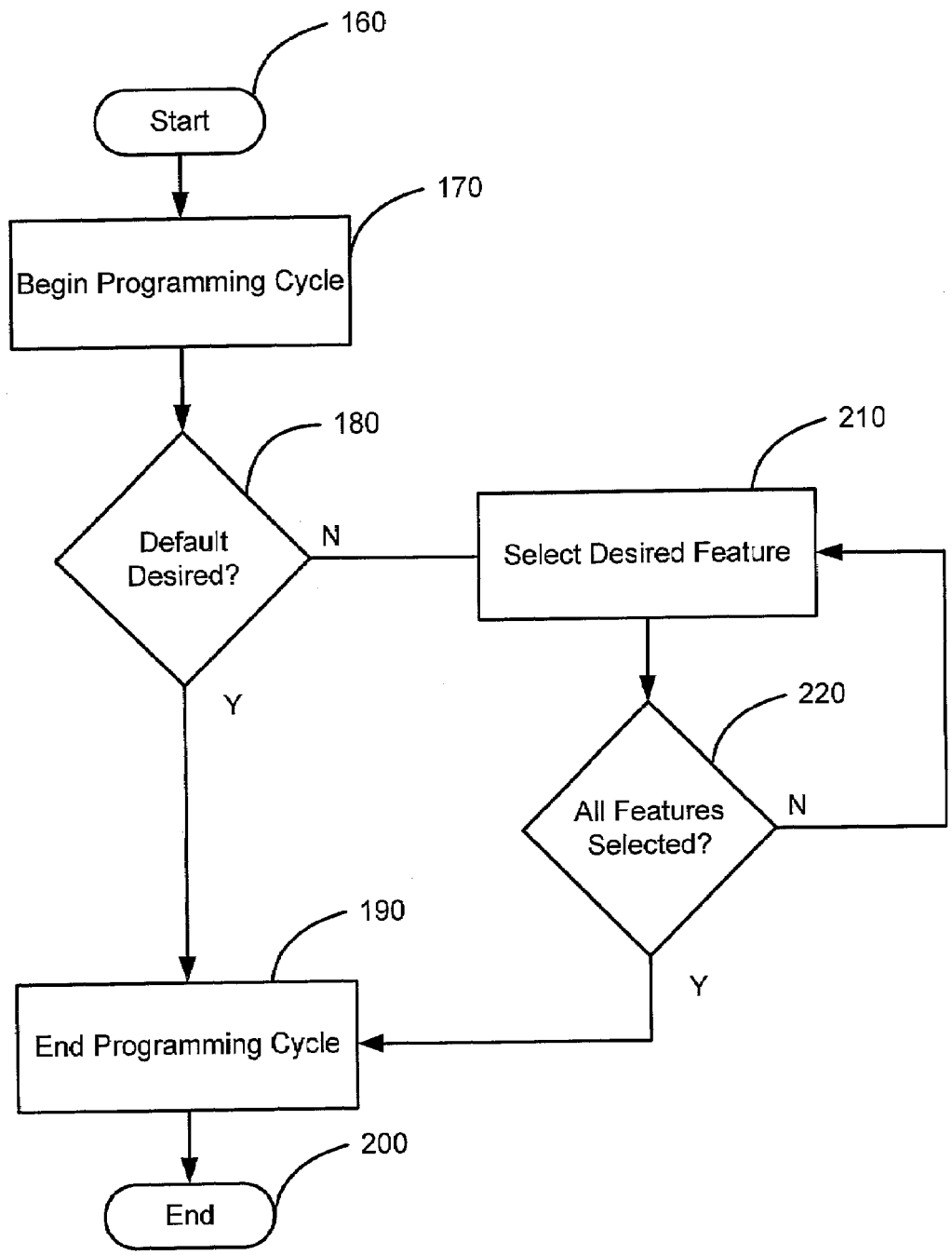
FIG. 3 is a flowchart illustrating an example of a method for programming a non-volatile memory according to the present invention.

FIG. 3 is a flowchart illustrating an example of a method for programming the non-volatile memory 150 according to the present invention. The process begins with steps 160 and 170 which include the start of the process and the beginning of the programming cycle, respectively. The beginning of the programming cycle may include the programming of the first of the Programming Bits. In query 180, it is determined whether the default values already stored in the non-volatile memory 150 are desired. The default values may or may not be all binary zeroes. If the default values of the non-volatile memory 150 are desired, then the process jumps to step 190. In step 190, the programming cycle ends. The ending of the programming cycle may include the programming of the second of the Programming Bits. With the programming of the second of the Programming Bits, the bits in the non-volatile memory 150 with Program Cycle Protection as set forth, for example, in FIG. 2 can not be further modified. The process ends in step 200.

In query 180, if it is determined that the default values of the non-volatile memory 150 are not desired, then the process jumps to step 210. In step 210, the device 100 is configured for a particular feature or a particular function by programming the corresponding bit or bits in the non-volatile memory 150. For example, the Encrypt_Engine mode control bit can be programmed to force the device 100 into the highest level of encryption security. After selecting a desired feature, the process moves to query 220 in which it is determined whether all of the features desired have been selected. If not, then the configuring of the device 100 continues back at step 210. If all of the desired features have been selected then the process jumps to steps 190 and 200 and the ending of the programming cycle and the ending of the process, respectively, as described above.

The use of the first Programming Bit (FPB) and the second Programming Bit (SPB) add a hardware layer of protection and security for the programming cycle. As indicated, after a successful programming cycle, both the FPB and the SPB have programmed values (e.g., both will have binary ones stored in the respective bits, the "11" state). Accordingly, the non-volatile memory 150 becomes operational and the device 100 can be configured according to the values programmed in the non-volatile memory 150.

Under other conditions in which both Programming Bits are not both programmed, the non-volatile memory 150 is not operational. In the case in which the FPB is programmed and the SPB is not programmed (e.g., the "10" state), for example, during an intermediate step of the programming cycle, read access to the non-volatile memory is disabled. The "10" state may also occur if a reset condition occurred during a programming cycle. Under such a condition, the non-volatile memory 150 will not allow any further programming and will be rendered invalid (i.e., cannot be accessed). The case in which the FPB is not programmed and the SPB is programmed (e.g., the "01" state), is an illegal state and should not occur. If either the "10" state or the "01" state does occur as the device 100 comes up from reset or during normal operation, it may be assumed that the non-volatile memory 150 was not programmed correctly or that the non-volatile memory 150 was improperly tampered with. In either case, access to the non-volatile memory 150 is disabled. The mode controls may also be enabled to their most secure state (e.g., programmed to binary ones).

Thus, it is seen that systems and methods for configuring device features via programmable memory are provided. One skilled in the art will appreciate that the present invention can be practiced by other than the preferred embodiments which are presented in this description for purposes of illustration and not of limitation, and that the present invention is limited only by the claims that follow. It is noted that equivalents for the particular embodiments discussed in this description may practice the present invention as well.

What is claimed is:

1. A set top box, comprising:
a chip that comprises a chip interface, a processor, and a memory array,
wherein the processor is coupled to the memory array and the chip interface via one or more buses,
wherein the memory array comprises non-volatile memory, wherein the non-volatile memory comprises a first bank of mode control bits, a second bank of mode control bits, device identification bits, first encryption key bits, second encryption key bits, and memory management bits,
wherein the first bank of mode control bits comprises an encryption engine mode control bit that selects between data encryption standard (DES) and triple data encryption standard (3DES), a data output mode control bit that enables or disables a data output interface of the set top box, a test port mode control bit that enables or disables access to test ports of the set top box, and reserved bits that enable or disable features or functions of the set top box,
wherein the second bank of mode control bits comprises first bits, a first lock bit that locks the first bits, second bits, and a second lock bit that locks the second bits,
wherein the memory management bits comprises programming bits that indicate programming status and cyclic redundancy check (CRC) bits,
wherein, during a programming cycle, a first bit of the memory management bits is programmed and the first bank of mode control bits are programmed,
wherein a second bit of the memory management bits is programmed to complete the programming cycle such that a portion of the non-volatile memory bits covered by the CRC bits is not further modified,
wherein the portion of the non-volatile memory bits covered by the CRC bits comprises the device identification bits, the first encryption key bits, the second encryption key bits, and the first bank of mode bits, and
wherein the CRC bits do not cover the second bank of mode control bits and the memory management bits.

2. The set top box according to claim 1, wherein the non-volatile memory is not used by the set top box to configure the set top box if the first bit of the memory management bits is programmed and if the second bit of the memory management bits is not programmed.

3. The set top box according to claim 1, wherein the non-volatile memory is used by the set top box to configure the set top box if the first bit of the memory management bits is programmed and if the second bit of the memory management bits is programmed.

4. The set top box according to claim 1, wherein the non-volatile memory is used by the set top box to configure the set top box if the portion of the non-volatile memory bits covered by the CRC bits is not further modified.

5. The set top box according to claim 1, wherein the non-volatile memory is rendered invalid if a reset condition occurs during the programming cycle.

6. The set top box according to claim 1, wherein the non-volatile memory is disabled if the set top box, during reset, reads that the first bit of the memory management bits is programmed and that the second bit of the memory management bits is not programmed.

7. The set top box according to claim 6, wherein the set top box, during reset, reads that the first bit and the second bit are in the "10" state.

8. The set top box according to claim 1, wherein the non-volatile memory is disabled if the set top box, during reset, reads that the first bit of the memory management bits is not programmed and that the second bit of the memory management bits is programmed.

9. The set top box according to claim 6, wherein the set top box, during reset, reads that the first bit and the second bit are in the "01" state.

10. The set top box according to claim 1, wherein the first bit and the second bit are programmed into the "11" state.

11. The set top box according to claim 1, wherein the first bits of the second bank of mode control bits are one-time programmed outside of the programming cycle and locked using the first lock bit of the second bank of mode control bits.

12. The set top box according to claim 11, wherein the second bits of the second bank of mode control bits are one-time programmed outside of the programming cycle and locked using the second lock bit of the second bank of mode control bits.

13. The set top box according to claim 12, wherein the first bits or the second bits of the second bank of mode control bits enable or disable features or functions of the set top box that were initially configured in the programming cycle without changing any values stored in the first bank of mode control bits.

14. The set top box according to claim 12, wherein the first bits or the second bits of the second bank of mode control bits enable or disable features or functions of the set top box that were initially configured in the programming cycle without changing any values stored in the first bank of mode control bits.

15. The set top box according to claim 12, wherein the first bits or the second bits of the second bank of mode control bits enhance or degrade features or functions of the set top box that was initially configured in the programming cycle without changing any values stored in the first bank of mode control bits.

16. The set top box according to claim 12, wherein the first bits or the second bits of the second bank of mode control bits enable, disable, enhance, or degrade a display configuration of the set top box that was initially configured in the programming cycle without changing any values stored in the first bank of mode control bits.

17. The set top box according to claim 12, wherein the first bits or the second bits of the second bank of mode control bits enable, disable, enhance, or degrade a sound configuration of the set top box that was initially configured in the programming cycle without changing any values stored in the first bank of mode control bits.

18. The set top box according to claim 12, wherein the first bits or the second bits of the second bank of mode control bits enable, disable, enhance, or degrade an authentication configuration of the set top box that was initially configured in the programming cycle without changing any values stored in the first bank of mode control bits.

19. The set top box according to claim 1,
wherein the programming cycle is remotely initiated such that the set top box wirelessly receives programming data, and
wherein, during the programming cycle, the programming data received by the processor via the chip interface is used to program the non-volatile memory of the memory array.

20. The set top box according to claim 1,
wherein the first bank of mode control bits is one-time programmed and locked during the programming cycle according to initial customer specifications, and
wherein, without modifying the first bank of mode control bits, a portion of the second bank of mode control bits is one-time programmed and locked outside of the programming cycle according to updated customer specifications to revise set top box configurations stored in the first bank of mode control bits.

* * * * *